US012796490B2

(12) United States Patent
Chen et al.

(10) Patent No.: US 12,796,490 B2
(45) Date of Patent: Nov. 10, 2026

(54) PACKAGE STRUCTURE AND METHOD FOR FORMING SAME

(71) Applicant: JCET Advanced Packaging Co., Ltd., Wuxi (CN)

(72) Inventors: Haijie Chen, Wuxi (CN); Changwen Wang, Wuxi (CN); Haoyu Liu, Wuxi (CN)

(73) Assignee: JCET Advanced Packaging Co., Ltd., Wuxi (CN)

( * ) Notice: Subject to any disclaimer, the term of this patent is extended or adjusted under 35 U.S.C. 154(b) by 328 days.

(21) Appl. No.: 18/639,951

(22) Filed: Apr. 18, 2024

(65) Prior Publication Data

US 2024/0404957 A1 Dec. 5, 2024

(30) Foreign Application Priority Data

May 30, 2023 (CN) ......................... 202310626087.2

(51) Int. Cl.
*H10W 70/60* (2026.01)
*H10W 70/00* (2026.01)
*H10W 90/00* (2026.01)

(52) U.S. Cl.
CPC ........ *H10W 70/611* (2026.01); *H10W 70/099* (2026.01); *H10W 90/401* (2026.01); *H10W 90/724* (2026.01)

(58) Field of Classification Search
CPC . H10W 70/05; H10W 70/685; H10W 72/072; H10W 72/20; H10W 90/701; H10W 70/611; H10W 70/099; H10W 90/401
See application file for complete search history.

(56) References Cited

U.S. PATENT DOCUMENTS

| | | | | |
|---|---|---|---|---|
| 9,978,693 B2 * | 5/2018 | Jeong | .................... | H10W 42/20 |
| 10,004,143 B2 * | 6/2018 | Ishihara | ................. | H05K 1/183 |
| 10,403,562 B2 * | 9/2019 | Baek | ........................ | H10P 72/74 |
| 11,075,193 B2 * | 7/2021 | Kang | ....................... | H10P 72/74 |
| 11,158,616 B2 * | 10/2021 | Jang | ....................... | H10W 20/42 |
| 12,074,104 B2 * | 8/2024 | Tsai | ......................... | H10P 72/74 |

* cited by examiner

*Primary Examiner* — Matthew L Reames

(74) *Attorney, Agent, or Firm* — Arch & Lake LLP; Hao Tan; Shen Wang

(57) ABSTRACT

A method for forming a package structure includes: providing an interposer, which includes a first redistribution layer including a first set of conductive pads and a second set of conductive pads; providing a device substrate, which includes a passive device layer and a second redistribution layer covering the passive device layer, the passive device layer including at least one passive device, and the second redistribution layer including a third set of conductive pads and a fourth set of conductive pads; bonding the interposer to the device substrate by a hybrid bonding process; removing part of the passive device layer from a surface, facing away from the interposer, of the device substrate; and arranging at least one chip on the surface, facing away from the interposer, of the device substrate, chip is electrically connected to the fourth set of conductive pads.

8 Claims, 6 Drawing Sheets

PACKAGE STRUCTURE AND METHOD FOR FORMING SAME

CROSS-REFERENCE TO RELATED APPLICATIONS

This application is based upon and claims priority to Chinese Patent Application No. 202310626087.2, filed on May 30, 2023, the entire content of which is incorporated herein by reference for all purposes.

TECHNICAL FIELD

The present disclosure relates to the technical field of semiconductor packaging, and in particular, relates to a package structure and a packaging method.

BACKGROUND

With the continuous evolution of advanced packaging technologies, the chiplet technology based on the advanced packaging technology has become an important way to improve the design efficiency. The chiplet technology refers to a semiconductor manufacturing approach where integrable dies with specific functions are prefabricated separately and then the dies having different functions and manufactured at different process nodes are integrated into a single package or system by using the system-in-package (SiP) technology and by interconnection and packaging architecture between effective dies.

Currently, employing an interposer is an effective way to achieve electrical interconnection between chips and between chips and substrates. However, the conventional interposer is not integrated with a passive device (for example, a capacitor). The passive device needs to be connected to the interposer by an additional process such as surface mount technology (SMT), which does not match the flip chip bonding process between the chips and between the chips and the substrates. In addition, the passive device typically has a large size, resulting in a waste of the area of the interposer, which is not conducive to miniaturization of a package structure.

Therefore, how to realize packaging between the passive device and the interposer becomes the focus of research.

SUMMARY

The technical problem to be solved by the present disclosure is to provide a package structure and a method for forming the same, which improve the compatibility of a package process, and is conducive to miniaturization of the package structure.

Some embodiments of the present disclosure provide a method for forming a package structure. The method includes: providing an interposer, wherein the interposer includes a first redistribution layer including a first set of conductive pads and a second set of conductive pads, wherein a first end of each of the first set of conductive pads and the second set of conductive pads are exposed on the first surface of the first redistribution layer; providing a device substrate, wherein the device substrate includes a passive device layer and a second redistribution layer covering the passive device layer, the passive device layer including at least one passive device, and the second redistribution layer including a third set of conductive pads and a fourth set of conductive pads, wherein a first end of each of the third set of conductive pads and the fourth set of conductive pads are exposed on a first surface of the second redistribution layer, and a second end of the third set of conductive pads are electrically connected to the passive device; bonding the interposer to the device substrate by a hybrid bonding process using the first surface of the first redistribution layer and the first surface of the second redistribution layer as a bonding surface, wherein the first set of conductive pads are electrically connected to the third set of conductive pads, and the second set of conductive pads are electrically connected to the fourth set of conductive pads; removing part of the passive device layer from a surface, facing away from the interposer, of the device substrate such that the fourth set of conductive pads are exposed; and arranging at least one chip on the surface, facing away from the interposer, of the device substrate, wherein the chip is electrically connected to the fourth set of conductive pads.

In some embodiments, prior to bonding the interposer to the device substrate by the hybrid bonding process, the method includes: planarizing the first surface of the first redistribution layer and the first surface of the second redistribution layer.

In some embodiments, prior to bonding the interposer to the device substrate by the hybrid bonding process, the method includes: activating the first surface of the first redistribution layer and the first surface of the second redistribution layer.

In some embodiments, the first redistribution layer includes a first dielectric layer, wherein the first set of conductive pads and the second set of conductive pads are arranged in the first dielectric layer and exposed on a surface of the first dielectric layer; and the second redistribution layer includes a second dielectric layer, wherein the third set of conductive pads and the fourth set of conductive pads are arranged in the second dielectric layer and exposed on a surface of the second dielectric layer; in bonding the interposer to the device substrate by the hybrid bonding process, the first dielectric layer is further bonded to the second dielectric layer; and in removing the passive device layer from the surface, facing away from the interposer, of the device substrate, the second dielectric layer is exposed.

In some embodiments, arranging the at least one chip on the surface, facing away from the interposer, of the device substrate includes: electrically connecting the chip to the fourth set of conductive pads by a flip chip bonding process on the surface, facing away from the interposer, of the device substrate.

In some embodiments, prior to arranging the at least one chip on the surface, facing away from the interposer, of the device substrate, the method includes: forming a third redistribution layer on the surface, facing away from the interposer, of the device substrate, wherein the third redistribution layer covers the device substrate, and the third redistribution layer includes a fifth set of conductive pads, wherein the fifth set of conductive pads are electrically connected to the fourth set of conductive pads, and the fifth set of conductive pads are exposed on a first surface of the third redistribution layer; and electrically connecting the chip to the fifth set of conductive pads by a flip chip bonding process on the first surface of the third redistribution layer.

In some embodiments, electrically connecting the at least one chip to the fifth set of conductive pads by the flip chip bonding process on the first surface of the third redistribution layer includes: forming a sixth set of conductive pads on the first surface of the third redistribution layer, wherein the sixth set of conductive pads are electrically connected to the fifth set of conductive pads; and electrically connecting the chip to the sixth set of conductive pads by the flip chip bonding process.

In some embodiments, providing the interposer includes: providing a carrier substrate and forming a sacrificial layer on the carrier substrate; and forming the first redistribution layer on the sacrificial layer; and removing the carrier substrate using the sacrificial layer as a separation layer upon arranging the at least one chip on the surface, facing away from the interposer, of the device substrate.

Some embodiments of the present disclosure provide a package structure. The package structure includes: an interposer including a first redistribution layer, wherein the first redistribution layer includes a first set of conductive pads and a second set of conductive pads; a device substrate including a passive device layer and a second redistribution layer covering the passive device layer, wherein the passive device layer includes at least one passive device, the second redistribution layer is hybrid bonded to the first redistribution layer, and the second redistribution layer includes a third set of conductive pads and a fourth set of conductive pads, wherein a first end of the third set of conductive pads are electrically connected to the first set of conductive pads and a second end of the third set of conductive pads are electrically connected to the passive device, and a first end of the fourth set of conductive pads are electrically connected to a first end of the second set of conductive pads and a second end of the fourth set of conductive pads are exposed on the passive device layer; and at least one chip arranged on a surface, facing away from the interposer, of the device substrate, wherein the chip is electrically connected to a second end of the fourth set of conductive pads.

In some embodiments, the first redistribution layer includes a first dielectric layer, wherein the first set of conductive pads and the second set of conductive pads are arranged in the first dielectric layer; and the second redistribution layer includes a second dielectric layer, wherein the third set of conductive pads and the fourth set of conductive pads are arranged in the second dielectric layer; the first dielectric layer is also bonded to the second dielectric layer, wherein material of the first dielectric layer is the same as a material of the second dielectric layer, or material of the first set of conductive pads are the same as a material of the third set of conductive pads.

In some embodiments, material of the first dielectric layer is the same as material of the second dielectric layer, and material of the first set of conductive pads is the same as material of the third set of conductive pads.

In some embodiments, the package structure further includes: a third redistribution layer covering the surface, facing away from the interposer, of the device substrate and including a fifth set of conductive pads, wherein a first end of the fifth set of conductive pads are electrically connected to the second end of the fourth set of conductive pads, and the at least one chip is arranged on a surface of the third redistribution layer and is electrically connected to a second end of the fifth set of conductive pads.

In some embodiments, the package structure further includes: a sixth set of conductive pads arranged on a surface, facing away from the device substrate, of the third redistribution layer, wherein a first end of the sixth set of conductive pads are electrically connected to the second end of the fifth set of conductive pads, and the chip is electrically connected to a second end of the sixth set of conductive pads.

With the method for forming the package structure according to the present disclosure, the passive device may be directly integrated in the interposer or on the surface of the interposer by a wafer-level packaging process prior to arranging the chip, with no need of connecting the passive device and the interposer by an additional SMT process, such that the compatibility of the process is greatly improved. Further, the passive device formed by this method has a small size, which greatly reduces the area of the interposer and is conducive to the miniaturization of the package structure. The chip and the passive device are arranged on the same side of the interposer, such that the passive device is close to the chip, and local energy storage may be achieved at a proximal end of the chip. In this way, the power integrity of the high-speed circuit of the package structure is significantly improved. In addition, during manufacture of the passive device in the device substrate, parameters of the passive device may be adjusted, for example, capacitances of capacitors may be adjusted by changing the manufacture process and adjusting a capacitance matrix area, such that the parameters of the passive device approach calculated values in simulation design, and precise matching between the passive device and the chip is achieved.

BRIEF DESCRIPTION OF THE DRAWINGS

For clearer descriptions of the technical solutions according to the embodiments of the present disclosure, hereinafter brief description is given with reference to the accompanying drawings for illustrating the embodiments. Apparently, the accompanying drawings described hereinafter only illustrate some embodiments of the present disclosure, and other accompanying drawings may also be derived by persons of ordinary skill in the art based on these accompanying drawings without any creative effort.

DETAILED DESCRIPTION

Hereinafter, specific embodiments of a package structure and a method for forming the package structure according to the present disclosure are described in detail with reference to the accompanying drawings.

Figure 1:
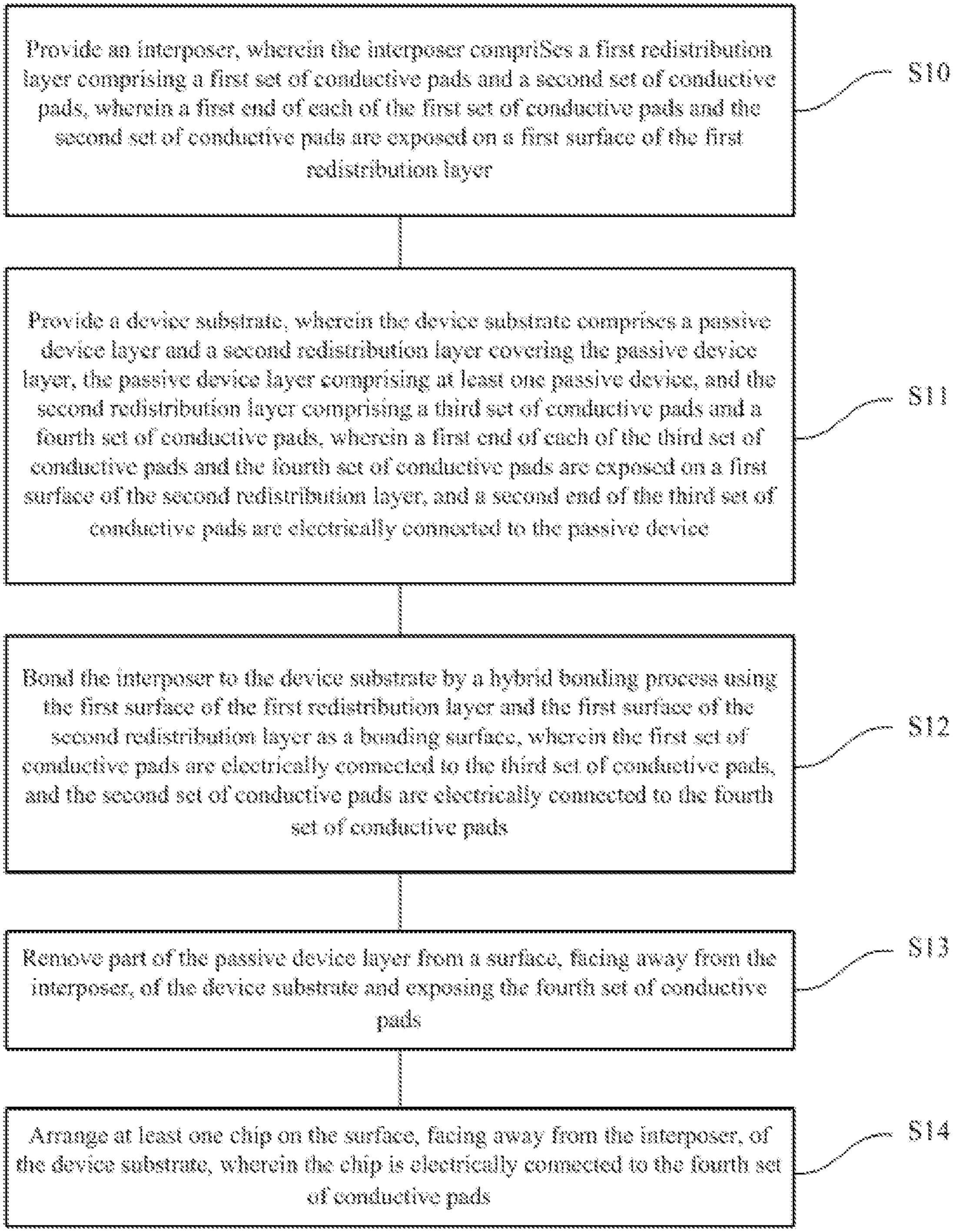
FIG. 1 is a schematic flowchart of steps of a method for forming a package structure according to an embodiment of the present disclosure.

FIG. 1 is a schematic flowchart of steps of a method for forming a package structure according to an embodiment of the present disclosure. Referring to FIG. 1, the method includes: S10, providing an interposer, wherein the interposer includes a first redistribution layer including a first set of conductive pads and a second set of conductive pads, wherein a first end of each of the first set of conductive pads and the second set of conductive pads are exposed on a first surface of the first redistribution layer; S11, providing a device substrate, wherein the device substrate includes a passive device layer and a second redistribution layer covering the passive device layer, the passive device layer including at least one passive device, and the second redistribution layer including a third set of conductive pads and a fourth set of conductive pads, wherein a first end of each of the third set of conductive pads and the fourth set of conductive pads are exposed on a first surface of the second redistribution layer, and a second end of the third set of conductive pads are electrically connected to the passive device; S12, bonding the interposer to the device substrate by a hybrid bonding process using the first surface of the first redistribution layer and the first surface of the second redistribution layer as a bonding surface, wherein the first set of conductive pads are electrically connected to the third set of conductive pads, and the second set of conductive pads are electrically connected to the fourth set of conductive pads; S13, removing part of the passive device layer from a surface, facing away from the interposer, of the device substrate such that the fourth set of conductive pads are exposed; and S14, arranging at least one chip on the surface, facing away from the interposer, of the device substrate, wherein the chip is electrically connected to the fourth set of conductive pads.

With the method for forming the package structure according to the present disclosure, the passive device may be directly integrated in the interposer or on the surface of the interposer by a wafer-level packaging process prior to arranging the chip, with no need of connecting the passive device and the interposer by an additional SMT process, such that the compatibility of the process is greatly improved. Further, the passive device formed by this method has a small size, which greatly reduces the area of the interposer and is conducive to the miniaturization of the package structure.

In a high-speed circuit, an instantaneous generated when a large number of devices are simultaneously turned on may cause fluctuations of voltages of the power supply and the ground, and consequently power integrity may be affected. Generally, an instantaneous response capacity of the power supply in the local region is enhanced by increasing a capacitor. The closer the capacitor is to the pins of the chip, the better local energy storage is achieved at a proximal end of the chip, such that the power integrity of the high-speed circuit is significantly improved. In the method for forming the package structure according to the present disclosure, the chip and the passive device are arranged on the same side of the interposer, such that the passive device is close to the chip, and local energy storage may be achieved at the proximal end of the chip. In this way, the power integrity of the high-speed circuit of the package structure is significantly improved.

In addition, during manufacture of the passive device in the device substrate, parameters of the passive device may be adjusted, for example, capacitances of capacitors may be adjusted by changing the manufacture process and adjusting a capacitance matrix area, such that the parameters of the passive device approach calculated values in simulation design, and precise matching between the passive device and the chip is achieved.

FIG. 2A to FIG. 2G are schematic diagrams of main steps of a method for forming a package structure according to an embodiment of the present disclosure.

Figure 2A:
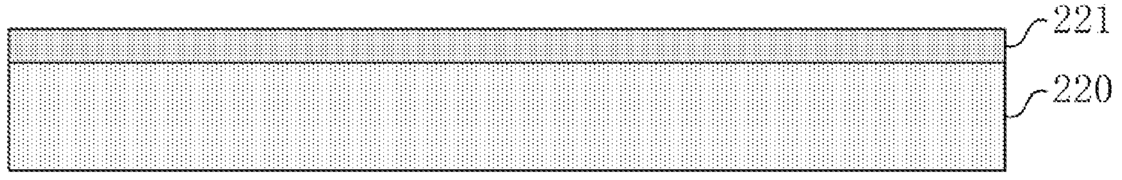
FIG. 2A is a schematic diagram of providing a carrier substrate and forming a sacrificial layer on the carrier substrate in a method for forming a package structure according to an embodiment of the present disclosure.
Figure 2B:
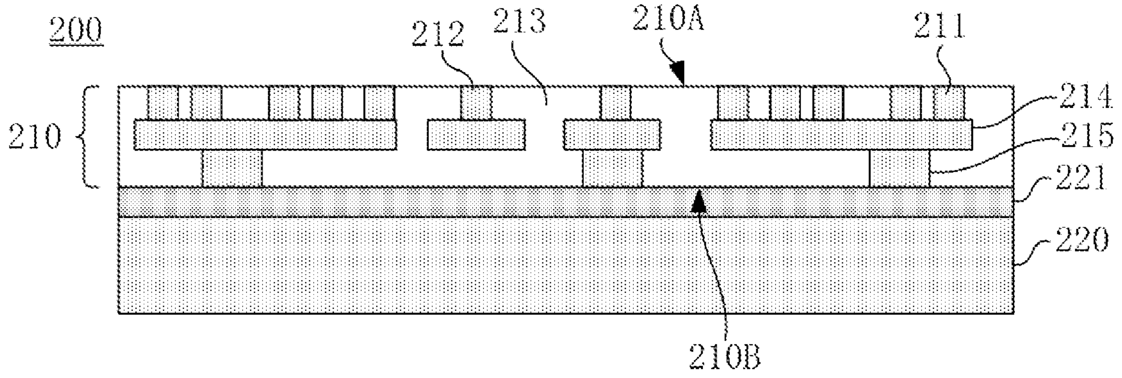
FIG. 2B is a schematic diagram of forming a first redistribution layer on a sacrificial layer in a method for forming a package structure according to an embodiment of the present disclosure.

Referring to FIG. 1 and FIG. 2B, in S10, an interposer 200 is provided. The interposer 200 includes a first redistribution layer 210 including a first set of conductive pads 211 and a second set of conductive pads 212. A first end of each of the first set of conductive pads 211 and the second set of conductive pads 212 are exposed on a first surface 210A of the first redistribution layer 210. The first set of conductive pads 211 and the second set of conductive pads 212 serve as an external connection resign of the first redistribution layer 210. The first set of conductive pads 211 and the second set of conductive pads 212 may both include a plurality of conductive pads.

In some embodiments, the first redistribution layer 210 includes a first dielectric layer 213. The first set of conductive pads 211 and the second set of conductive pads 212 are disposed in the first dielectric layer 213 and are exposed on a surface of the first dielectric layer 213. In this embodiment, the first set of conductive pads 211 and the second set of conductive pads 212 are exposed on a top surface of the first dielectric layer 213. The top surface serves as the first surface 210A of the first redistribution layer 210.

In some embodiments, the first dielectric layer 213 is an organic dielectric layer. The organic dielectric layer may be made of an organic resin. The organic resin includes, but is not limited to, an epoxy resin (FR4), a bismaleimide-triazine (BT) resin, polyphenylene ether (PPE) resin, or a polyimide (PI) resin.

In some embodiment, the first set of conductive pads 211 and the second set of conductive pads 212 may be both copper bumps, and materials thereof may also be different. For example, in this embodiment, the first set of conductive pads 211 and the second set of conductive pads 212 are copper bumps.

In some embodiments, the first redistribution layer 210 further includes a metallization layer 214 and at least one bottom conductive pads 215. The metallization layer 214 is arranged in the first dielectric layer 213, and the first set of conductive pads 211 and the second set of conductive pads 212 are electrically connected to the metallization layer 214.

The bottom conductive pads 215 are arranged in the first dielectric layer 213, and the bottom conductive pads 215 are electrically connected to the metallization layer 214. A second end of the bottom conductive pads 215 are exposed on a bottom surface of the first dielectric layer 213, and is configured to serve as an external connection region of the bottom of the interposer 200. The bottom surface of the first dielectric layer 213 serves as the second surface 210B of the first redistribution layer 210, and the second surface 210B is opposite to the first surface 210A. The first set of conductive pads 211 are electrically connected to the second set of conductive pads 212 via the metallization layer 214.

In some embodiments, providing the interposer 200 includes the following steps.

Referring to FIG. 2A, a carrier substrate 220 is provided, and a sacrificial layer 221 is formed on the carrier substrate 220. The carrier substrate 220 may be a carrier wafer, which provides a support for the subsequently formed interposer 200. The sacrificial layer 221 is configured to serve as a release layer for releasing the interposer 200 from the carrier substrate 220.

Referring to FIG. 2B, the first redistribution layer 210 is formed on the sacrificial layer 221. In this step, the bottom conductive pads 215, the metallization layer 214, the first set of conductive pads 211, and the second set of conductive pads 212 may be formed by performing the redistribution process for multiple times. The second surface 210B of the first redistribution layer 210 is in contact with the sacrificial layer 221.

Figure 2C:
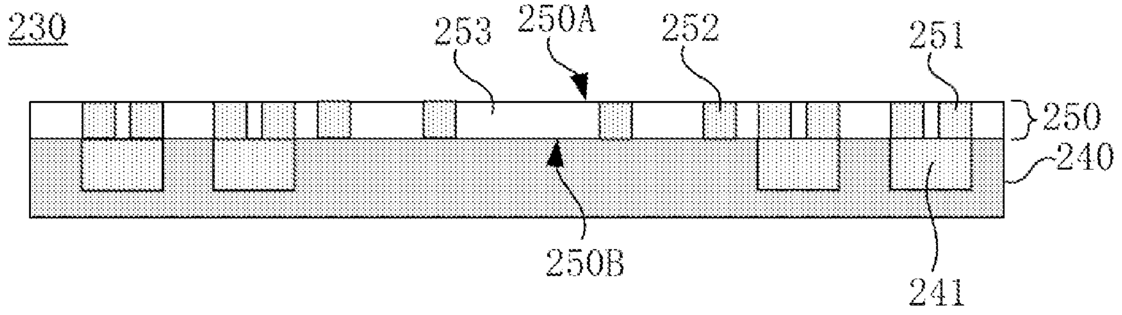
FIG. 2C is a schematic diagram of providing a device substrate in a method for forming a package structure according to an embodiment of the present disclosure.

Referring to FIG. 1 and FIG. 2C, in S11, a device substrate 230 is provided. The device substrate 230 includes a passive device layer 240 and a second redistribution layer 250 covering the passive device layer 240. The passive device layer 240 includes at least one passive device 241, and the second redistribution layer 250 includes a third set of conductive pads 251 and a fourth set of conductive pads 252. A first end of each of the third set of conductive pads 251 and the fourth set of conductive pads 252 are exposed on a first surface 250A of the second redistribution layer 250, and a second end of the third set of conductive pads 251 are electrically connected to the passive device 241.

The passive device 241 includes, but is not limited to, a resistor, a capacitor, or an inductor. For example, in this embodiment, the passive device 241 is a capacitor, and the passive device layer 240 is a capacitor layer, which may be obtained by preparing a capacitor on a wafer by a semiconductor process. The capacitor includes, but is not limited to, a trench capacitor.

The third set of conductive pads 251 are electrically connected to the passive device 241, and serve as pins of the passive device 241. The fourth set of conductive pads 252 are not electrically connected to the passive device 241, but serves as an electrical connection structure between the interposer 200 and the chip 260 in the package structure formed by the method for forming the package structure according to the present disclosure. In some embodiments, the first set of conductive pads 251 and the second set of conductive pads 252 may both include a plurality of conductive pads. In this embodiment, the third set of conductive pads 251 includes a plurality of conductive pads, and the passive device 241 is a capacitor. The conductive pads are electrically connected to a positive electrode or a negative electrode of the capacitor, and serve as pins of the positive electrode or the negative electrode of the capacitor.

In some embodiments, the second redistribution layer 250 includes a second dielectric layer 253. The third set of conductive pads 251 and the fourth set of conductive pads 252 are disposed in the second dielectric layer 253 and are exposed on a surface of the second dielectric layer 253. In this embodiment, the third set of conductive pads 251 and the fourth set of conductive pads 252 are exposed on a top surface of the second dielectric layer 253. The top surface serves as the first surface 250A of the second redistribution layer 250. A bottom surface of the second dielectric layer 253 is opposite to the top surface. The bottom surface is in contact with the passive device layer 240, which serves as the second surface 250B of the second redistribution layer 250.

In some embodiments, the second dielectric layer 253 is an organic dielectric layer. The organic dielectric layer may be made of an organic resin. The organic resin includes, but is not limited to, an epoxy resin (FR4), a bismaleimide-triazine (BT) resin, polyphenylene ether (PPE) resin, or a polyimide (PI) resin. In some embodiments, the first dielectric layer 213 and the second dielectric 253 are layers made of the same materials, and in this case, in the subsequent bonding process, the first dielectric layer 213 and the second dielectric layer 253 are bonded more securely.

In some embodiment, the third set of conductive pads 251 and the fourth set of conductive pads 252 may be both metal pads, and materials thereof may also be different. For example, in this embodiment, the third set of conductive pads 251 and the fourth set of conductive pads 252 are copper pads. In some embodiments, the third set of conductive pads 251 and the first set of conductive pads 211 may be made of the same material, and the fourth set of conductive pads 252 and the second set of conductive pads 212 may be made of the same material. In this case, in the subsequent bonding process, both the third set of conductive pads 251 and the first set of conductive pads 211, and the fourth set of conductive pads 252 and the second set of conductive pads 212 are bonded more securely.

In this embodiment, the third set of conductive pads 251 and the fourth set of conductive pads 252 pass through the second dielectric layer 253, and two ends of the third set of conductive pads 251 and the fourth set of conductive pads 252 are respectively exposed on a first surface 250A and a second surface 250B of the second redistribution layer 250. In some other embodiments, the third set of conductive pads 251 and the fourth set of conductive pads 252 are only arranged in a partial region under the first surface 250A of the second redistribution layer 250, and are electrically led out from the second surface 250B of the second redistribution layer 250 via the metallization layer arranged in the second dielectric layer 253. That is, the third set of conductive pads 251 are electrically connected to the passive device 241 via the metallization layer, and the fourth set of conductive pads 252 are led out the second surface 250B of the second redistribution layer 250 via the metallization layer.

In the method for forming the package structure according to the embodiments of the present disclosure, during manufacture of the passive device 241 in the device substrate 230, the parameters, for example, the capacitances of the capacitors, of the passive device 241 may be adjusted, such that the passive device 241 and the subsequently arranged chip 260 are precisely matched.

Figure 2D:
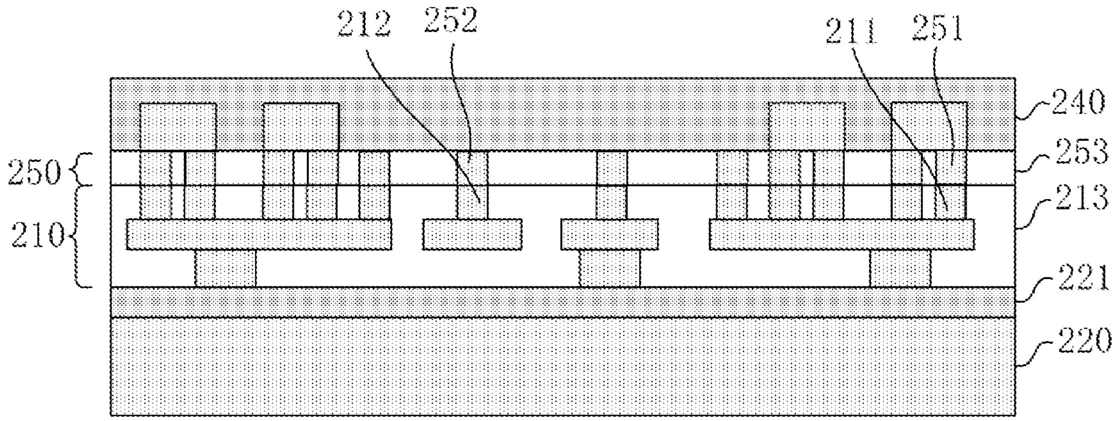
FIG. 2D is a schematic diagram of bonding an interposer to a device substrate by a hybrid bonding process in a method for forming a package structure according to an embodiment of the present disclosure.

Referring to FIG. 1 and FIG. 2D, in S12, the interposer 200 is bonded to the device substrate 230 by a hybrid bonding process using the first surface 210A of the first redistribution layer 210 and the first surface 250A of the second redistribution layer 250 as a bonding surface. The first set of conductive pads 211 are electrically connected to the third set of conductive pads 251, and the second set of conductive pads 212 are electrically connected to the fourth set of conductive pads 252. The structure formed by the hybrid bonding process has a higher current carrying capacity and a better thermal performance. In some embodiments, the top surface of the first dielectric layer 213 is also bonded to the top surface of the second dielectric layer 253.

The hybrid bonding process includes: attaching the first surface of the first redistribution layer 210 of the interposer 200 onto the first surface 250A of the second redistribution layer 250 of the interposer 230, wherein the first dielectric layer 213 is bonded to the second dielectric layer 253; performing annealing, such that the first set of conductive pads 211 are bonded to the third set of conductive pads 251, and the second set of conductive pads 212 are bonded to the fourth set of conductive pads 252 such that a bonding structure is formed.

In some embodiments, prior to the bonding process, the first surface 210A of the first redistribution layer 210 and/or the first surface 250A of the second redistribution layer 250 is planarized. That is, prior to the bonding process, planarization treatment is performed for the first surface 210A of the first redistribution layer 210 and the first surface 250A of the second redistribution layer 250, or one of the first surface 210A of the first redistribution layer 210 and the first surface 250A of the second redistribution layer 250 is planarized, such that surface roughness is reduced, and the bonding strength of the package structure formed by bonding is enhanced. The planarization treatment includes, but is not limited to, chemical mechanical polishing (CMP).

In some embodiments, prior to the bonding process, activation treatment is performed for the first surface 210A of the first redistribution layer 210 and/or the first surface 250A of the second redistribution layer 250, such that an activation site is formed on the first surface 210A of the first redistribution layer 210 and/or the first surface 250A of the second redistribution layer 250. In this way, the strength of bonding between the first redistribution layer 210 and the second redistribution layer 250 is enhanced. The activation process includes, but is not limited to, plasma activation treatment. Specifically, prior to the bonding process, activation treatment is performed for the first surface 210A of the first redistribution layer 210 and/or the first surface 250A of the second redistribution layer 250, such that an activation site is formed on the surface of the first dielectric layer 213 and/or the second dielectric layer 253. In this way, the strength of bonding between the first dielectric layer 213 and the second dielectric layer 253 is enhanced.

In some embodiments, prior to the bonding process, activation treatment is performed for the first surface 210A of the first redistribution layer 210 and the first surface 250A of the second redistribution layer 250. In some other embodiments, prior to the bonding process, activation treatment is performed for one of the first surface 210A of the first redistribution layer 210 and the first surface 250A of the second redistribution layer 250.

Figure 2E:
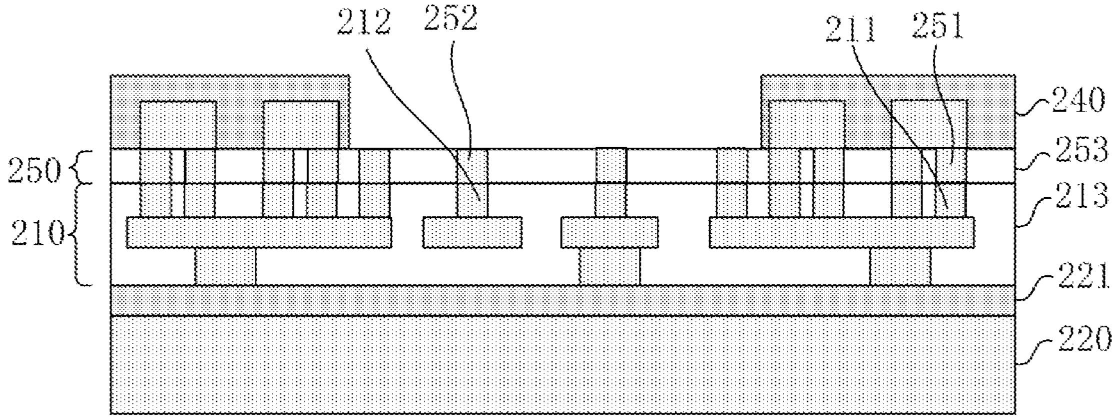
FIG. 2E is a schematic diagram of removing a portion of a passive device layer from a surface, facing away from an interposer, of a device substrate in a method for forming a package structure according to an embodiment of the present disclosure.

Referring to FIG. 1 and FIG. 2E, in S13, the passive device layer 240 is received from a surface, facing away from the interposer 200, of the device substrate 230, such that the fourth set of conductive pads 252 are exposed.

The fourth set of conductive pads 252 corresponds to a region, where the passive device 241 is not arranged, of the passive device layer 240. In this step, the region, where the passive device 241 is not arranged, of the passive device layer 240 is removed from the surface, facing away from the interposer 200, of the device substrate 230, such that the fourth set of conductive pads 252 are exposed.

The method for removing the region of the passive device layer 240 includes, but is not limited to, an etching process. For example, in some embodiments, the method for removing the region of the passive device layer 240 includes: a patterned mask layer is formed on the surface, facing away from the interposer 200, of the device substrate 230, wherein the mask layer shields a region, where the passive device is arranged, of the passive device layer 240, and exposes the region of the passive device layer 240 corresponding to the fourth set of conductive pads 252; etching the passive device layer 240 using the mask layer as a mask before the fourth set of conductive pads 252 are exposed; and removing the mask layer.

Figure 2F:
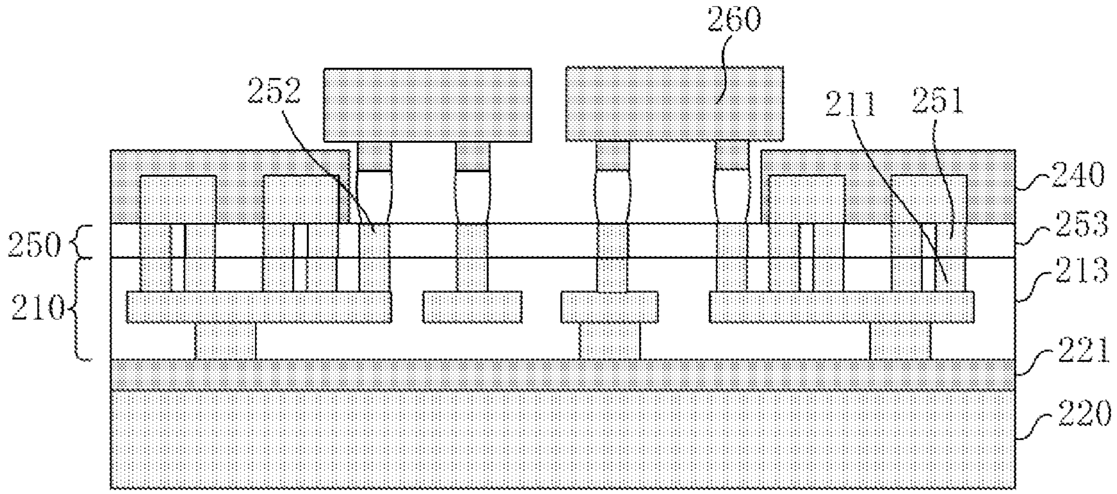
FIG. 2F is a schematic diagram of arranging at least one chip a surface, facing away from an interposer, of a device substrate in a method for forming a package structure according to an embodiment of the present disclosure.

Referring to FIG. 1 and FIG. 2F, in S14, at least one chip 260 is arranged on the surface, facing away from the interposer 200, of the device substrate 230. The chip 260 is electrically connected to the fourth set of conductive pads 252. The chip 260 and the passive device 241 are arranged on the same side of the interposer 200, such that the passive device 241 is close to the chip 260, and hence local energy storage is achieved at a proximal end of the chip.

One or more chips 260 may be arranged, which are all arranged on the first surface 250A of the second redistribution layer 250. The conductive pads on a side, facing towards the device substrate 230, of the chip 260 are electrically connected to the fourth set of conductive pads 252, and hence the chip 260 is electrically connected to the interposer 200. In some embodiments, the chip 260 may be electrically connected to the fourth set of conductive pads 252 by the flip chip bonding process.

Figure 2G:
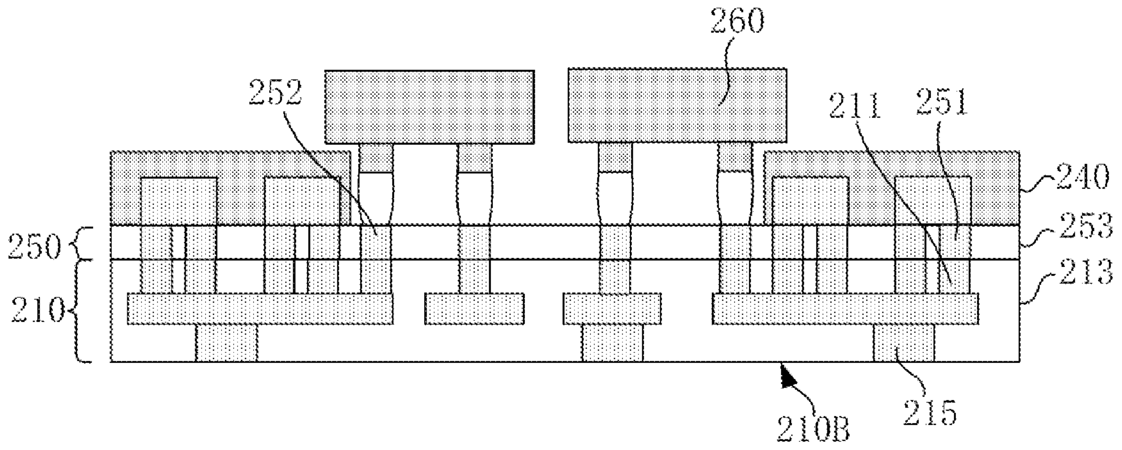
FIG. 2G is schematic diagram of removing a carrier substrate using a sacrificial layer as a release layer in a method for forming a package structure according to an embodiment of the present disclosure.

Further, in some embodiments, the method further includes: removing the carrier substrate 220 using the sacrificial layer 221 as a release layer. Referring to FIG. 2G, the carrier substrate 220 is removed using the sacrificial layer 221 as the release layer, such that the second surface 210B of the first redistribution layer 210 is exposed, and the bottom conductive pads 215 are also exposed and are thus electrically connected to an external substrate.

The method for removing the carrier substrate 220 may be determined depending on a material of the sacrificial layer 221. For example, where the sacrificial layer 221 is made of a soluble substance, the sacrificial layer 221 may be removed by soaking in a release solution, and hence the carrier substrate 220 is removed; where the sacrificial layer 221 is made of a laser sensitive material, the sacrificial layer 221 may be irradiated with laser such that the sacrificial layer 221 is modified, and hence the carrier substrate 220 is removed.

With the method for forming the package structure according to the present disclosure, prior to arranging the chip 260, the passive device 241 may be directly integrated in the interposer 200 or on the surface of the interposer by a wafer-level packaging process prior to arranging the chip 260, with no need of connecting the passive device 241 and the interposer 200 by an additional SMT process, such that the compatibility of the process is greatly improved. Further, the passive device formed by this method has a small size, which greatly reduces the area of the interposer 200 and is conducive to the miniaturization of the package structure.

In some embodiments, upon exposure of the fourth set of conductive pads 252, the chip 260 may be directly mounted to form a package structure, as illustrated in FIG. 2F. In some other embodiments, prior to arranging the chip 260 on the surface, facing away from the interposer 200, of the device substrate 230, the method further includes forming a third redistribution layer 300, and the chip 260 is mounted upon formation of the third redistribution layer 300.

Figure 3A:
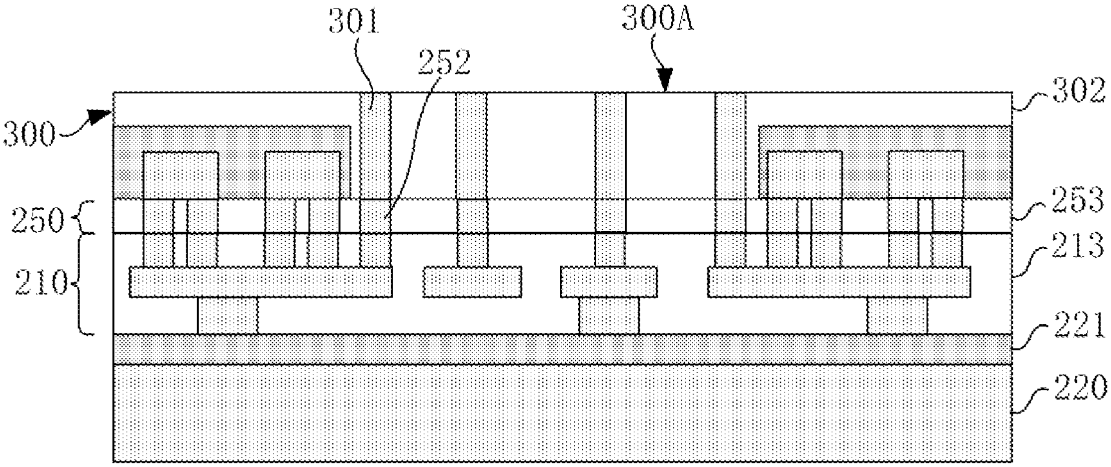
FIG. 3A is a schematic diagram of forming a third redistribution layer on a surface, facing away from an interposer, of a device substrate in a method for forming a package structure according to an embodiment of the present disclosure.
Figure 3B:
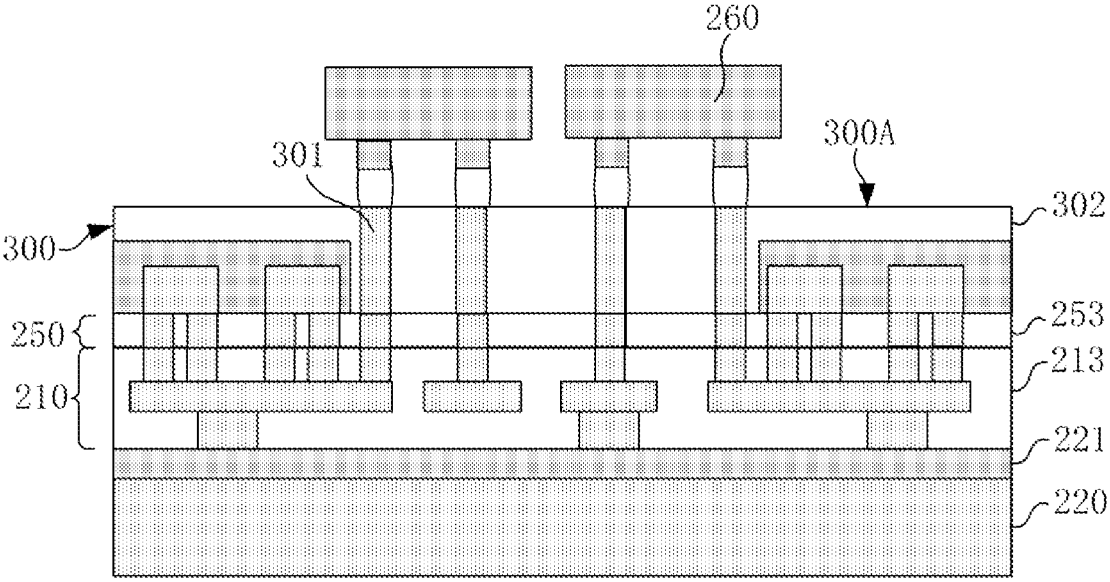
FIG. 3B is a schematic diagram of electrically connecting a chip to a fifth set of conductive pads by a flip chip bonding process on a first surface of a third redistribution layer in a method for forming a package structure according to an embodiment of the present disclosure.

Specifically, referring to FIG. 3A which is drawn based on the structure in FIG. 2E, the third redistribution layer 300 is formed on the surface, facing away from the interposer 200, of the device substrate 230. The third redistribution layer 300 covers the device substrate 230, and the third redistribution layer 300 includes a fifth set of conductive pads 301. The fifth set of conductive pads 301 are electrically connected to the fourth set of conductive pads 252, and the fifth set of conductive pads 301 are exposed on a first surface 300A of the third redistribution layer 300. Referring to FIG. 3B, on the first surface 300A of the third redistribution layer 300, the chip 260 is electrically connected to the fifth set of conductive pads 301 by a flip chip bonding process. The conductive pads on a side, facing towards the device substrate 230, of the chip 260 are electrically connected to the fifth set of conductive pads 301, and hence the chip 260 is electrically connected to the interposer 200.

The third redistribution layer 300 covers the surface exposed by the passive device 240 and the surface exposed by the second redistribution layer 250. In some embodiments, the third redistribution layer 300 includes a third dielectric layer 302. The third dielectric layer 302 covers a surface of the passive device layer 240 and a surface of the second redistribution layer 250. A top surface of the third dielectric layer 302 serves as the first surface 300A of the third redistribution layer 300. The fifth set of conductive pads 301 pass through the third dielectric layer 302. A first end of the fifth set of conductive pads 301 are connected to the fourth set of the fourth set of conductive pads 252, and a second end of the fifth set of conductive pads 301 are exposed on a surface of the third dielectric layer 302. In some embodiments, the third dielectric layer 302 is an organic dielectric layer, and the third dielectric layer 302 and the second dielectric layer 253 are made of the same material; and the conductive pads in the fifth set of conductive pads 301 are metal conductive pads, and the fifth set of conductive pads 301 and the fourth set of conductive pads 252 are made of the same material.

Figure 4A:
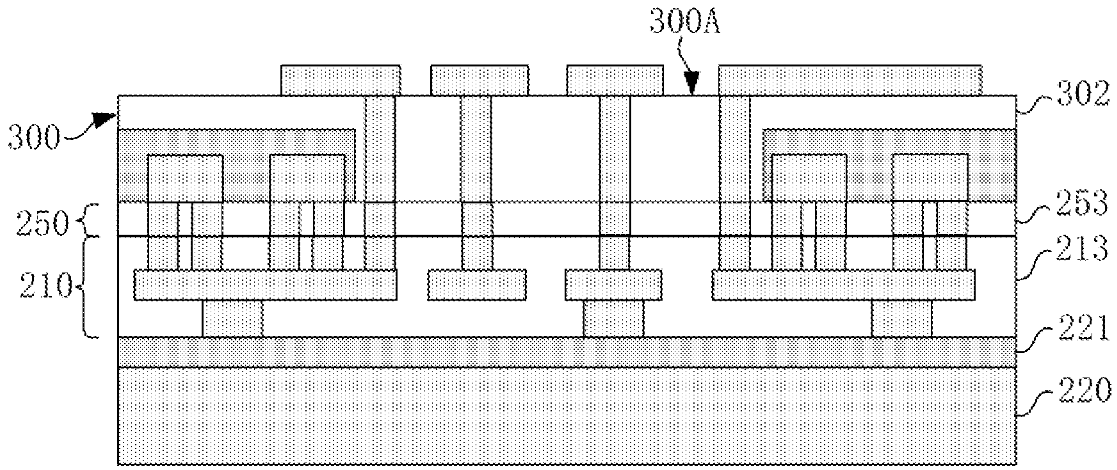
FIG. 4A is a schematic diagram of forming a sixth set of conductive pads on a first surface of a third redistribution layer in a method for forming a package structure according to an embodiment of the present disclosure.
Figure 4B:
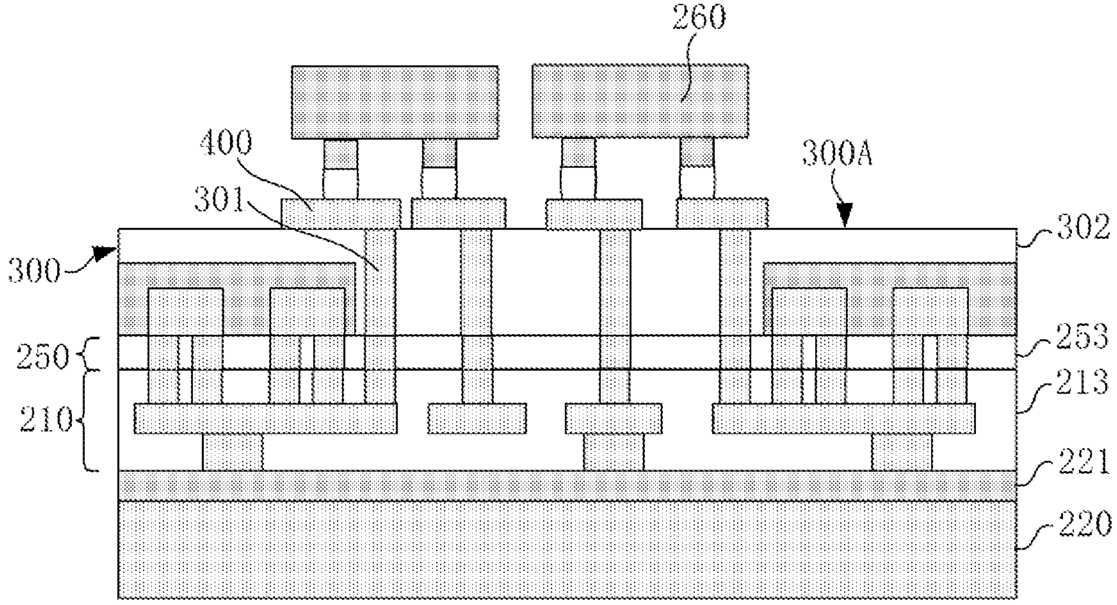
FIG. 4B is a schematic diagram of electrically connecting a chip to a sixth set of conductive pads by a flip chip bonding process in a method for forming a package structure according to an embodiment of the present disclosure.

In some other embodiments, upon formation of the third redistribution layer 300, the method further includes: forming a sixth set of conductive pads 400. Specifically, referring to FIG. 4A which is drawn based on the structure in FIG. 3A, a sixth set of conductive pads 400 are formed on the first surface of the third redistribution layer 300. The sixth set of conductive pads 400 are electrically connected to the fifth set of conductive pads 301. Referring to FIG. 4B, the chip 260 is electrically connected to the sixth set of conductive pads 400 by the flip chip bonding process.

The sixth set of conductive pads 400 are arranged on the surface of the third dielectric layer 302 and are electrically connected to the fifth set of conductive pads 301, which may fan out the fifth set of conductive pads 301. In this way, packaging and integration of an even smaller chip 260 are achieved.

Some embodiments of the present disclosure further provide a package structure that is formed using the method for forming the package structure as described above. Referring to FIG. 2A to FIG. 2G, the package structure includes: an interposer 200 including a first redistribution layer 210, wherein the first redistribution layer 210 includes a first set of conductive pads 211 and a second set of conductive pads 212; a device substrate 230 including a passive device layer 240 and a second redistribution layer 250 covering the passive device layer 240, wherein the passive device layer 240 includes at least one passive device 241, the second redistribution layer 250 is hybrid bonded to the first redistribution layer 210, and the second redistribution layer 250 includes a third set of conductive pads 251 and a fourth set of conductive pads 252, wherein a first end of the third set of conductive pads 251 are electrically connected to the first set of conductive pads 211 and a second end of the third set of conductive pads 251 are electrically connected to the passive device 241, and a first end of the fourth set of conductive pads 252 are electrically connected to a first end of the second set of conductive pads 212 and a second end of the fourth set of conductive pads 252 are exposed on the passive device layer 240; and at least one chip 260 arranged on a surface, facing away from the interposer 200, of the device substrate 230, wherein the at chip 260 is electrically connected to the second end of the fourth set of conductive pads 252.

In the package structure according to the embodiments of the present disclosure, the passive device 241 is integrated in the interposer 200 or on a surface of the interposer 200, and the passive device 241 such integrated greatly reduces the area of the interposer 200, which is conducive to miniaturization of the package structure. The chip 260 and the passive device 241 are arranged on the same side of the interposer 200, such that the passive device 241 is close to the chip 260, and hence local energy storage is achieved at a proximal end of the chip. In addition, the passive device 241 and the chip 260 are precisely matched, and the performance of the package structure is enhanced.

In some embodiments, the first redistribution layer 210 includes a first dielectric layer 213. The first set of conductive pads 211 and the second set of conductive pads 212 are disposed in the first dielectric layer 213. In some embodiments, the first redistribution layer 210 further includes a metallization layer 214 and at least one bottom conductive pads 215. The metallization layer 214 is arranged in the first dielectric layer 213, and the first set of conductive pads 211 and the second set of conductive pads 212 are electrically connected to the metallization layer 214. The bottom conductive pads 215 are arranged in the first dielectric layer 213, and the bottom conductive pads 215 are electrically connected to the metallization layer 214. A second end of the bottom conductive pads 215 are exposed on a bottom surface of the first dielectric layer 213, and is configured to serve as an external connection region of the bottom of the interposer 200.

The passive device 241 includes, but is not limited to, a resistor, a capacitor, or an inductor. For example, in this embodiment, the passive device 241 is a capacitor, and the passive device layer 240 is a capacitor layer. The second redistribution layer 250 includes a second dielectric layer 253. The third set of conductive pads 251 and the fourth set of conductive pads 252 are disposed in the second dielectric layer 253. The third set of conductive pads 251 are electrically connected to the passive device 241, and the first dielectric layer 213 is further bonded to the second dielectric layer 253.

In some embodiment, the first dielectric layer 213 and the second dielectric layer 253 are made of the same material, and/or the first set of conductive pads 211 and the third set of conductive pads 251 are made of the same material. For example, the first dielectric layer 213 and the second dielectric layer 253 are both organic dielectric layers, and the first set of conductive pads 211 and the third set of conductive pads 251 are both copper pads. In some embodiment, the fourth set of conductive pads 252 and the second set of conductive pads 212 may be made of the same material, for example, copper pads.

The chip 260 and the passive device 241 are arranged on the same side of the interposer 200, such that the passive device 241 is close to the chip 260, and hence local energy storage is achieved at a proximal end of the chip. In some embodiments, the conductive pads on a side, facing towards the device substrate 230, of the chip 260 are electrically connected to the fourth set of conductive pads 252, and hence the chip 260 is electrically connected to the interposer 200.

In the above embodiments, the chip 260 is directly electrically connected to the fourth set of conductive pads 252. In some other embodiments, the chip 260 is electrically connected to the fourth set of conductive pads 252 via the third redistribution layer 300. Specifically, referring to FIG. 3B, the semiconductor structure further includes a third redistribution layer 300. The third redistribution layer 300 covers the surface, facing away from the interposer 200, of the device substrate 230. The third redistribution layer 300 includes a fifth set of conductive pads 301. A first end of the fifth set of conductive pads 301 is electrically connected to the second end of the fourth set of conductive pads 252, and the chip 260 is arranged on a surface of the third redistribution layer 300 and is electrically connected to a second end of the fifth set of conductive pads 301.

In some embodiments, the third redistribution layer 300 includes a third dielectric layer 302. The third dielectric layer 302 covers the surface of the passive device layer 240 and the surface of the second redistribution layer 250. The fifth set of conductive pads 301 passes through the third dielectric layer 302. A first end of the fifth set of conductive pads 301 are connected to the fourth set of the fourth set of conductive pads 252, and a second end of the fifth set of conductive pads 301 are electrically connected to the chip 260. In some embodiments, the third dielectric layer 302 and the second dielectric layer 253 are made of the same material, or the fifth set of conductive pads 301 and the fourth set of conductive pads 252 are made of the same material.

In some embodiments, the third dielectric layer 302 and the second dielectric layer 253 are made of the same material, and the fifth set of conductive pads 301 and the fourth set of conductive pads 252 are made of the same material.

In some embodiments, the package structure further includes a sixth set of conductive pads 400. In some embodiments, referring to FIG. 4B, the sixth set of conductive pads 400 are arranged on the surface, facing away from the device substrate 230, of the third redistribution layer 300, and a first end of the sixth set of conductive pads 400 are electrically connected to the second end of the fifth set of conductive pads 301, and the chip 260 is electrically connected to a second end of the sixth set of conductive pads 400. The sixth set of conductive pads 400 are arranged on the surface of the third dielectric layer 302 and are electrically connected to the fifth set of conductive pads 301, which may fan out the fifth set of conductive pads 301. In this way, package and integration of an even smaller chip 260 are achieved.

In addition, terms "comprise," "include," and variations thereof used herein in the text of the present disclosure are intended to define a non-exclusive meaning. It should be noted that the terms such as "first," "second," and the like in the specifications, claims and the accompanying drawings of the present disclosure are intended to distinguish different objects but are not intended to define a specific order or a definite time sequence. Unless otherwise clearly indicated in the context, it should be understood that the data used in this way can be interchanged under appropriate circumstances. The term "one or more" may be used to describe a feature, structure, or characteristic in the singular, or may be used to describe a feature, structure, or combination of features in the plural, depending at least in part on the context. The term "based on" may be understood as not necessarily intended to express a set of exclusive factors, but may alternatively allow for the presence of other factors not necessarily explicitly described, again depending at least in part on the context. In cases of no conflict, the embodiments and features in the embodiments of the present disclosure may be combined together. Further, in the above description, descriptions of well-known components and techniques are omitted so as not to unnecessarily obscure the inventive concepts of the present disclosure. In various embodiments of the present disclosure, the same or similar parts between the embodiments may be referenced to each other. In each embodiment, the portion that is different from other embodiments is concentrated and described.

Described above are preferred embodiments of the present disclosure. It should be noted that persons of ordinary skill in the art may derive other improvements or polishments without departing from the principles of the present disclosure. Such improvements and polishments shall be deemed as falling within the protection scope of the present disclosure.

The invention claimed is:

1. A method for forming a package structure, comprising:

providing an interposer, wherein the interposer comprises a first redistribution layer comprising a first set of conductive pads and a second set of conductive pads, wherein a first end of each of the first set of conductive pads and the second set of conductive pads are exposed on a first surface of the first redistribution layer;

providing a device substrate, wherein the device substrate comprises a passive device layer and a second redistribution layer covering the passive device layer, the passive device layer comprising at least one passive device, and the second redistribution layer comprising a third set of conductive pads and a fourth set of conductive pads, wherein a first end of each of the third set of conductive pads and the fourth set of conductive pads are exposed on a first surface of the second redistribution layer, and a second end of the third set of conductive pads are electrically connected to the passive device;

bonding the interposer to the device substrate by a hybrid bonding process using the first surface of the first redistribution layer and the first surface of the second redistribution layer as a bonding surface, wherein the first set of conductive pads are electrically connected to the third set of conductive pads, and the second set of conductive pads are electrically connected to the fourth set of conductive pads;

removing part of the passive device layer from a surface, facing away from the interposer, of the device substrate and exposing the fourth set of conductive pads; and arranging at least one chip on the surface, facing away from the interposer, of the device substrate, wherein the chip is electrically connected to the fourth set of conductive pads.

2. The method according to claim 1, wherein prior to bonding the interposer to the device substrate by the hybrid bonding process, the method comprises:

planarizing at least one of the first surface of the first redistribution layer and the first surface of the second redistribution layer.

3. The method according to claim 1, wherein prior to bonding the interposer to the device substrate by the hybrid bonding process, the method comprises:

activating at least one of the first surface of the first redistribution layer and the first surface of the second redistribution layer.

4. The method according to claim 1, wherein the first redistribution layer comprises a first dielectric layer, wherein the first set of conductive pads and the second set of conductive pads are arranged in the first dielectric layer and exposed on a surface of the first dielectric layer; and the second redistribution layer comprises a second dielectric layer, wherein the third set of conductive pads and the fourth set of conductive pads are arranged in the second dielectric layer and exposed on a surface of the second dielectric layer;

wherein bonding the interposer to the device substrate by the hybrid bonding process comprises bonding the first dielectric layer to the second dielectric layer; and wherein removing the passive device layer from the surface, facing away from the interposer, of the device substrate further comprises exposing the second dielectric layer.

5. The method according to claim 1, wherein arranging the at least one chip on the surface, facing away from the interposer, of the device substrate comprises:

electrically connecting the chip to the fourth set of conductive pads by a flip chip bonding process on the surface, facing away from the interposer, of the device substrate.

6. The method according to claim 1, wherein prior to arranging the at least one chip on the surface, facing away from the interposer, of the device substrate, the method comprises:

forming a third redistribution layer on the surface, facing away from the interposer, of the device substrate, wherein the third redistribution layer covers the device substrate, and the third redistribution layer comprises a fifth set of conductive pads, wherein the fifth set of conductive pads are electrically connected to the fourth set of conductive pads, and the fifth set of conductive pads are exposed on a first surface of the third redistribution layer; and electrically connecting the chip to the fifth set of conductive pads by a flip chip bonding process on the first surface of the third redistribution layer.

7. The method according to claim 6, wherein electrically connecting the at least one chip to the fifth set of conductive pads by the flip chip bonding process on the first surface of the third redistribution layer comprises:

forming a sixth set of conductive pads on the first surface of the third redistribution layer, wherein the sixth set of conductive pads are electrically connected to the fifth set of conductive pads; and electrically connecting the chip to the sixth set of conductive pads by the flip chip bonding process.

8. The method according to claim 1, wherein providing the interposer comprises:

providing a carrier substrate, forming a sacrificial layer on the carrier substrate, and forming the first redistribution layer on the sacrificial layer; and removing the carrier substrate using the sacrificial layer as a separation layer upon arranging the at least one chip on the surface, facing away from the interposer, of the device substrate.

* * * * *